US011563322B2

(12) United States Patent
Peters et al.

(10) Patent No.: US 11,563,322 B2
(45) Date of Patent: Jan. 24, 2023

(54) RC SNUBBER

(71) Applicant: Infineon Technologies AG, Neubiberg (DE)

(72) Inventors: Dethard Peters, Hoechstadt (DE); Thomas Basler, Ottenhofen (DE); Paul Sochor, Erlangen (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 205 days.

(21) Appl. No.: 17/019,746

(22) Filed: Sep. 14, 2020

(65) Prior Publication Data

US 2022/0085601 A1    Mar. 17, 2022

(51) Int. Cl.
| | | |
|---|---|---|
| *H02H 3/20* | (2006.01) | |
| *H02H 9/04* | (2006.01) | |
| *H01L 27/06* | (2006.01) | |
| *H01L 49/02* | (2006.01) | |
| *H01L 29/16* | (2006.01) | |
| *H01L 29/20* | (2006.01) | |
| *H01L 29/78* | (2006.01) | |
| *H01L 29/808* | (2006.01) | |
| *H01L 29/92* | (2006.01) | |

(52) U.S. Cl.
CPC .......... *H02H 9/04* (2013.01); *H01L 27/0629* (2013.01); *H01L 28/20* (2013.01); *H01L 29/1608* (2013.01); *H01L 29/2003* (2013.01); *H01L 29/7813* (2013.01); *H01L 29/8083* (2013.01); *H01L 29/92* (2013.01)

(58) Field of Classification Search
CPC ....... H02H 9/04; H01L 27/0629; H01L 28/20; H01L 29/813; H01L 29/1608; H01L 29/2003; H01L 29/8083; H01L 29/92
USPC ....................................... 361/91.5
See application file for complete search history.

(56) References Cited

U.S. PATENT DOCUMENTS

| | | | |
|---|---|---|---|
| 2009/0242977 A1 | 10/2009 | Kawaguchi et al. | |
| 2012/0049263 A1 | 3/2012 | Lin | |
| 2014/0264477 A1 | 9/2014 | Bhalla et al. | |
| 2017/0263747 A1 | 9/2017 | Ichijo et al. | |
| 2018/0182750 A1* | 6/2018 | Burke | H01L 23/5228 |

OTHER PUBLICATIONS

European Search Report, from Corresponding European Application No. 21020444.2, dated Feb. 9, 2022, 9 pages.

\* cited by examiner

*Primary Examiner* — Jared Fureman
*Assistant Examiner* — Lucy M Thomas
(74) *Attorney, Agent, or Firm* — Cooper Legal Group LLC

(57) ABSTRACT

An apparatus includes a unipolar power transistor and an RC snubber. The RC snubber has a capacitor between a poly silicon structure and a semiconductor substrate. The capacitor has a p-n junction. The RC snubber has a resistor between a source of the unipolar power transistor and a first layer forming the capacitor. The unipolar transistor and the RC snubber are coupled in parallel. The RC snubber and the unipolar power transistor are formed monolithically on the semiconductor substrate.

15 Claims, 4 Drawing Sheets

RC SNUBBER

TECHNICAL FIELD

The present disclosure relates to the field of dampening oscillations within semiconductor devices.

BACKGROUND

Various types of transistors, such as silicon carbide metal-oxide-semiconductor field-effect transistors (SiC MOS-FETS) and other types of transistors, may be used for applications in high power and high voltage range use, such as in traction and wind energy applications. These types of applications may utilize high currents and large power modules or parallel connection modules. Operation of these transistors may result in relatively high commutation inductances, such as in the range of 20 nH-100 nH per commutation path. If a load current in one of these transistors is switched off quickly, commutation oscillations may be triggered. The commutation oscillations can result in electromagnetic interference and/or failure to comply with electromagnetic interference limits. Such commutation oscillations are undesirable for applications that utilize high load currents.

SUMMARY

This Summary is provided to introduce a selection of concepts in a simplified form that are further described below in the Detailed Description. This Summary is not intended to identify key factors or essential features of the claimed subject matter, nor is it intended to be used to limit the scope of the claimed subject matter.

In an embodiment of the techniques presented herein, an apparatus is provided. The apparatus comprises a unipolar power transistor. The apparatus comprises an RC snubber coupled in parallel within the unipolar power transistor. The RC snubber and the unipolar power transistor are formed monolithically on a semiconductor substrate. The RC snubber comprises a capacitor. The capacitor is between a poly silicon structure and the semiconductor substrate. The capacitor comprises a p-n junction. The RC snubber comprises a resistor. The resistor is between a source of the unipolar power transistor and a first layer forming the capacitor.

To the accomplishment of the foregoing and related ends, the following description and annexed drawings set forth certain illustrative aspects and implementations. These are indicative of but a few of the various ways in which one or more aspects may be employed. Other aspects, advantages, and novel features of the disclosure will become apparent from the following detailed description when considered in conjunction with the annexed drawings.

DETAILED DESCRIPTION

Figure 1:
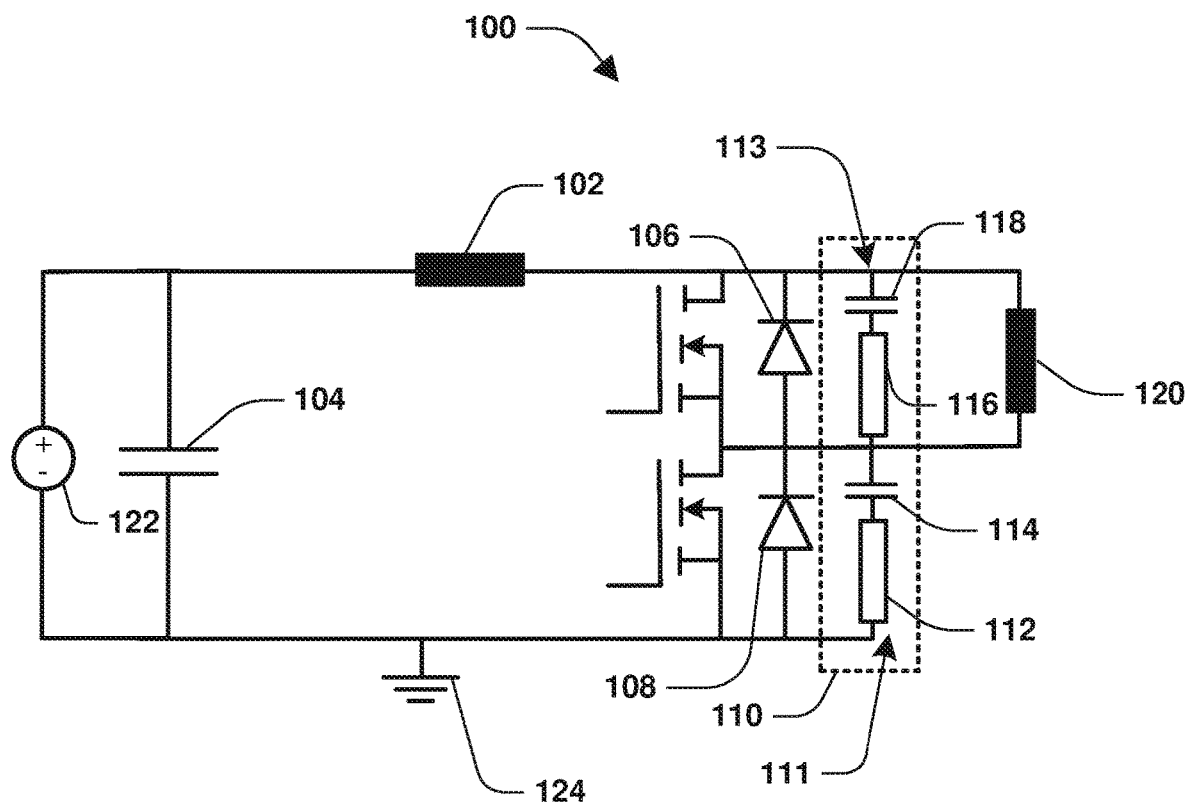
FIG. 1 is a component block diagram illustrating an apparatus comprising a half-bridge including two transistors each one coupled in parallel with an RC snubber formed on a same semiconductor substrate.

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details. In other instances, well-known structures and devices are shown in block diagram form in order to facilitate describing the claimed subject matter.

Within the field of electronics, transistors such as silicon carbide metal-oxide-semiconductor field-effect transistors (SiC MOSFETS), silicon carbide junction gate field-effect transistors (SiC JFET), unipolar power transistors, etc., may be used for various applications, such as for switching in high powered and/or high voltage applications. When a transistor of a device is being switched, commutation oscillations can be triggered, thus causing undesirable oscillation energy within the device that can negatively affect operation of the device. For example, the commutation oscillations may be triggered when the transistor is used as a power transistor with high voltages (e.g., voltages over 600 volts) such that switching off the transistor is so rapid that commutation oscillations result. These commutation oscillations can be high-frequency LC oscillations that negatively affect operation of the device. For example, the commutation oscillations can result in electromagnetic interference that impact the correct operation of the device. In an example of electromagnetic interference, a transistor may be initially in an off state. While in the on state, a drain and source voltage of the transistor is low. When the transistor is switched off, voltage starts to increase until reaching a DC voltage. Current starts to decrease during a normal operation mode, and thus oscillations will start to occur. The oscillations will cause unwanted electromagnetic interference.

One technique for dampening commutation oscillations in a device relates to using insulated-gate bipolar transistor (IGBT) components or unipolar components such as SiC MOSFETs that can be operated with high gate resistances. However, this can result in increased switching losses that negatively affect the overall efficiency of the device. Another technique that can be used to help dampen commutation oscillations in a device relates to the use of an RC network/snubber. An RC snubber can be used for power electronics to react to high-frequency LC oscillations in order to dampen such oscillations. With the oscillations, a capacitor of the RC snubber causes current through a resistor in order to dampen the oscillations, which also results in a loss that could be unacceptable. These RC snubbers are external to the transistors that are being dampened, such as being placed on a load connection or on auxiliary connections. This causes leakage inductance (parasitic inductance) between the RC snubber and the transistor (the chip).

Accordingly, as provided herein, an RC snubber is integrated into an apparatus for damping oscillations of a unipolar power transistor of the apparatus. The RC snubber and the unipolar power transistor are coupled together in parallel. The RC snubber and the unipolar power transistor are formed monolithically on the same semiconductor substrate, and thus the RC snubber and the unipolar power transistor are integrated together within the same semiconductor device, such as where a resistor and a capacitor of the RC snubber are formed from layers of materials making up the unipolar power transistor, and thus the RC snubber is formed as part of the unipolar power transistor. Because the RC snubber is integrated into the apparatus and is formed on the same semiconductor substrate as the unipolar power transistor, the RC snubber can be positioned closer to (as part of) the unipolar power transistor than if the RC snubber was external to the unipolar power transistor. This provides improved damping of oscillations while reducing leakage inductance otherwise resulting from the RC snubber being external to the apparatus and unipolar power transistor. Because the RC snubber is integrated into the unipolar power transistor, less area within the apparatus is consumed by the RC snubber. Integration of the RC snubber into the unipolar power transistor allows for scaling out for devices that comprise a large number of unipolar power transistors since each unipolar power transistor has its own integrated RC snubber.

The disclosed RC snubber provides various advantages over external RC snubbers and other techniques used to dampen oscillations, such as oscillations in applications with high Lxl products, where an Lxl product corresponds to a product of a commutation inductance (e.g., inductance 102 of FIG. 1) and current flowing therethrough. With this RC snubber, there is no additional/external component being used as the RC snubber since the RC snubber is integrated into the apparatus and the unipolar power transistor. Because the RC snubber is incorporated within the unipolar power transistor, such as within an area under a gate pad that is already part of the apparatus, little to no additional area is consumed by the RC snubber. The RC snubber provides dissipation of power loss in the RC snubber because the apparatus is well cooled. The RC snubber can work directly against oscillation to dampen the oscillation because there is no parasitic inductance involved. The RC snubber scales with the number of parallel apparatuses/transistors in a module because the RC snubbers are integrated into each apparatus/transistor.

FIG. 1 illustrates an apparatus including module 100 comprising RC snubbers 110. The apparatus further comprises a DC link capacitor 104. The DC link capacitor may be used as an intermediate circuit capacitor that provides a low impedance path for switching currents and provides energy storage. The module 100 may be connected to a load 120. The module 100 comprises a first body diode 108. In an embodiment, the module 100 comprises a first unipolar power transistor, and the first body diode 108 is between a drain and a source of the first unipolar power transistor. The first body diode 108 is formed by a p-n junction of the first unipolar power transistor between the source and the drain of the first unipolar power transistor. The module 100 may comprise any number of unipolar power transistors, such as a second unipolar power transistor that has a second body diode 106 between a drain and a source of the second unipolar power transistor. The second body diode 106 is formed by a p-n junction of the second unipolar power transistor between the source and the drain of the second unipolar power transistor. The unipolar transistors of module 100 selectively couple load 120 to either a DC link potential 122 or to ground 124. DC link potential may be 600V, 1200V, 1800V or even 3.3 kV or higher in some embodiments. Ground 124 may be 0V or even below 0V in some embodiments. The module 100 has an inductance 102, such as a parasitic inductance corresponding to the inductance of a connection between the DC link capacitor 104 and the module 100.

In an embodiment, the first unipolar power transistor and/or the second unipolar power transistor are SiC MOSFET transistors. In an embodiment, the first unipolar power transistor and/or the second unipolar power transistor are SiC JFET transistors. In an embodiment, the first unipolar power transistor and/or the second unipolar power transistor are 3 terminal transistors because the RC snubbers are integrated into the unipolar power transistors without the need of additional terminals to connect to external RC snubbers.

The module 100 may comprise any number of RC snubbers 110, such as a first RC snubber 111 integrated into and coupled with the first unipolar power transistor in parallel and a second RC snubber 113 integrated into and coupled within the second unipolar power transistor in parallel. The first RC snubber 111 and the first unipolar power transistor are formed monolithically on a first semiconductor substrate. In an embodiment, the first semiconductor substrate comprises a silicon carbide substrate. In an embodiment, the first semiconductor substrate comprises a gallium nitride substrate. The second RC snubber 113 and the second unipolar power transistor are formed monolithically on a second semiconductor substrate. In an embodiment, the second semiconductor substrate comprises a silicon carbide substrate. In an embodiment, the second semiconductor substrate comprises a gallium nitride substrate.

The first RC snubber 111 comprises a first capacitor 114 and a first resistor 112. The first capacitor 114 is located between a poly silicon structure of the first unipolar power transistor and the first semiconductor substrate. The poly silicon structure may be connected to the source of the first unipolar power transistor. The poly silicon structure separates a drain of the first unipolar power transistor from a gate of the first unipolar power transistor. The first capacitor 114 comprises a p-n junction, such as the p-n junction of the first unipolar power transistor that forms the first body diode 108. The p-n junction may comprise a first layer comprising p type material and a second layer comprising n type material. The second layer is between the first layer and the second semiconductor substrate. The first capacitor 114 is located at an output side of the first unipolar power transistor. The first resistor 112 is located between a source of the first unipolar power transistor and the first layer forming the first capacitor 114. In an embodiment, the first resistor 112 comprises an n type material connected to the source of the first unipolar power transistor. In an embodiment, the first resistor 112 is formed from an n type source doping bridge within the first unipolar power transistor. In an embodiment, the first resistor 112 and the first capacitor 114 are electrically coupled to one another.

The second RC snubber 113 comprises a second capacitor 118 and a second resistor 116. The second capacitor 118 is located between a poly silicon structure of the second unipolar power transistor and the second semiconductor substrate. The poly silicon structure may be connected to the source of the second unipolar power transistor. The poly silicon structure separates a drain of the second unipolar power transistor from a gate of the second unipolar power transistor. The second capacitor 118 comprises a p-n junction, such as the p-n junction of the second unipolar power transistor that forms the second body diode 106. The p-n junction may comprise a first layer comprising p type material and a second layer comprising n type material. The second layer is between the first layer and the second semiconductor substrate. The second capacitor 118 is located at an output side of the second unipolar power transistor. The second resistor 116 is located between a source of the second unipolar power transistor and the first layer forming the second capacitor 118. In an embodiment, the second resistor 116 comprises an n type material connected to the source of the second unipolar power transistor. In an embodiment, the second resistor 116 is formed from an n type source doping bridge within the first unipolar power transistor. In an embodiment, the second resistor 116 and the second capacitor 118 are electrically coupled to one another.

In an embodiment, the module 100 may comprise an RC snubber layer. The RC snubber layer may comprise an RC snubber used to dampen oscillations within a unipolar power transistor. The RC snubber layer may comprise a plurality of resistors. In order to distribute losses from the RC snubber, the resistors may be implemented as resistance bridges positioned around one or more sides of a gate pad of the unipolar power transistor in order to distribute the resistance, and thus distribute the losses from the RC snubber dampening the oscillations.

Figure 2:
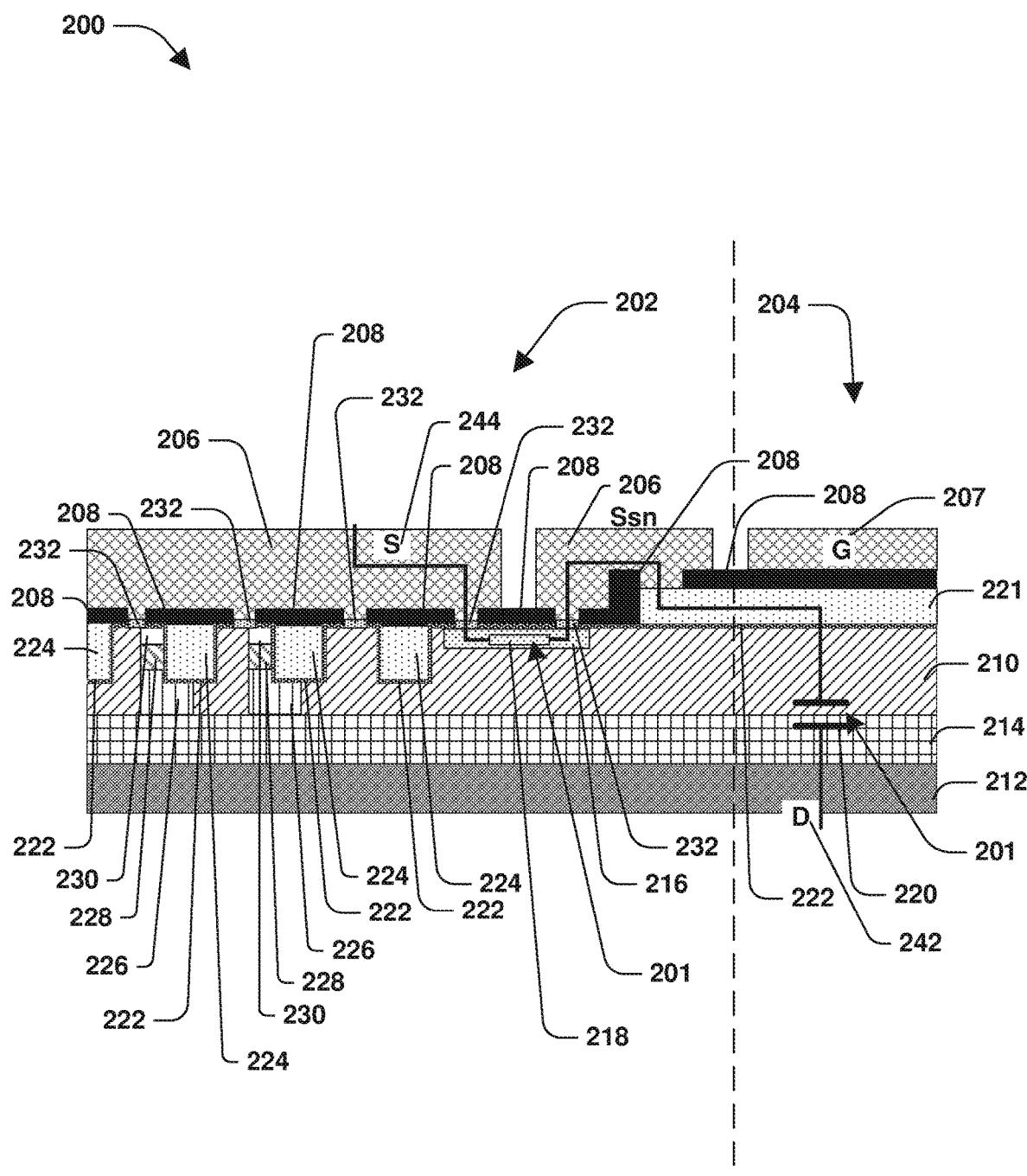
FIG. 2 is a cross section of an apparatus comprising a transistor coupled in parallel with an RC snubber formed on a same semiconductor substrate.
Figure 3:
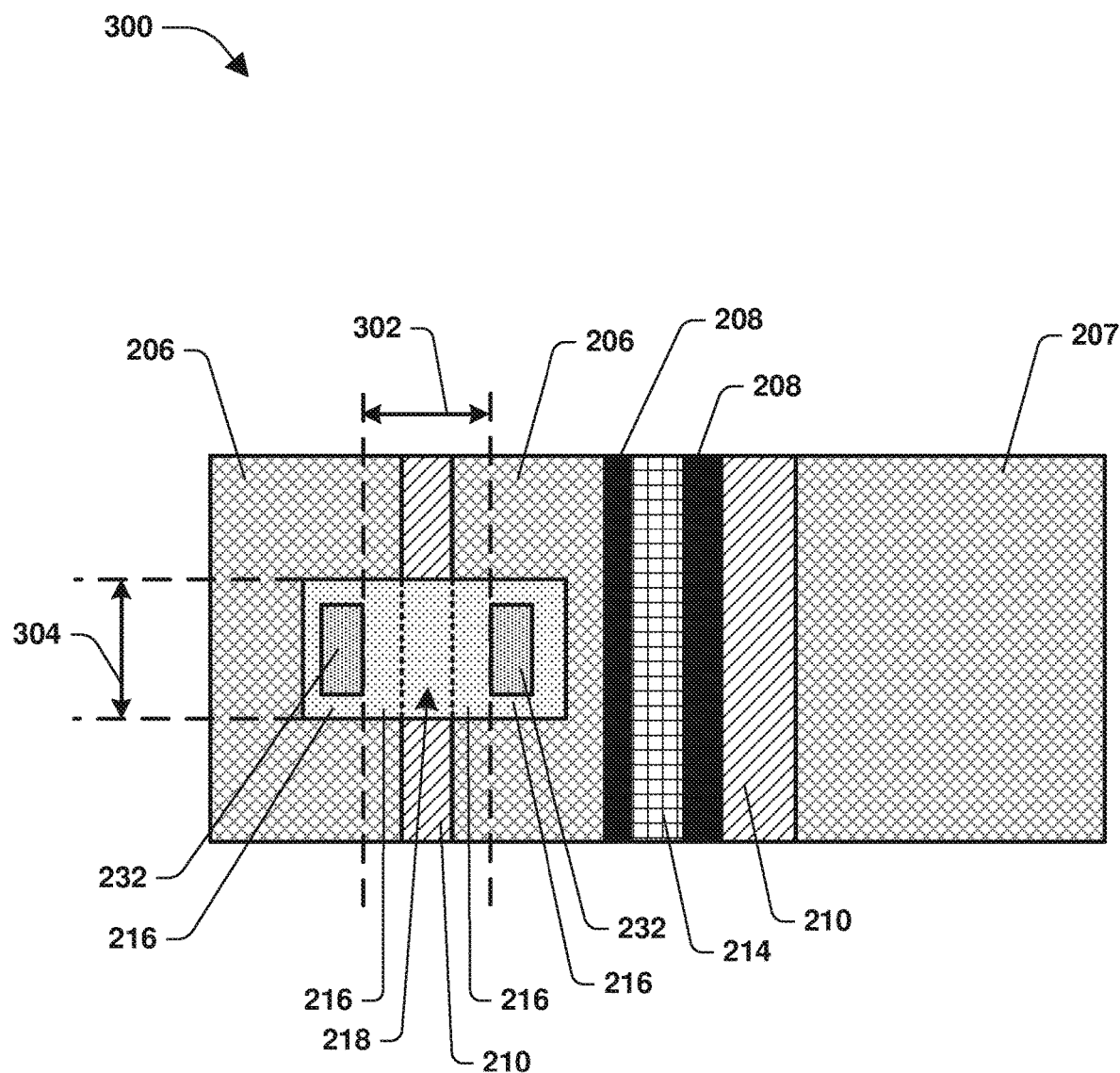
FIG. 3 is a top down view of an apparatus comprising a transistor coupled in parallel with an RC snubber formed on a same semiconductor substrate.
Figure 4:
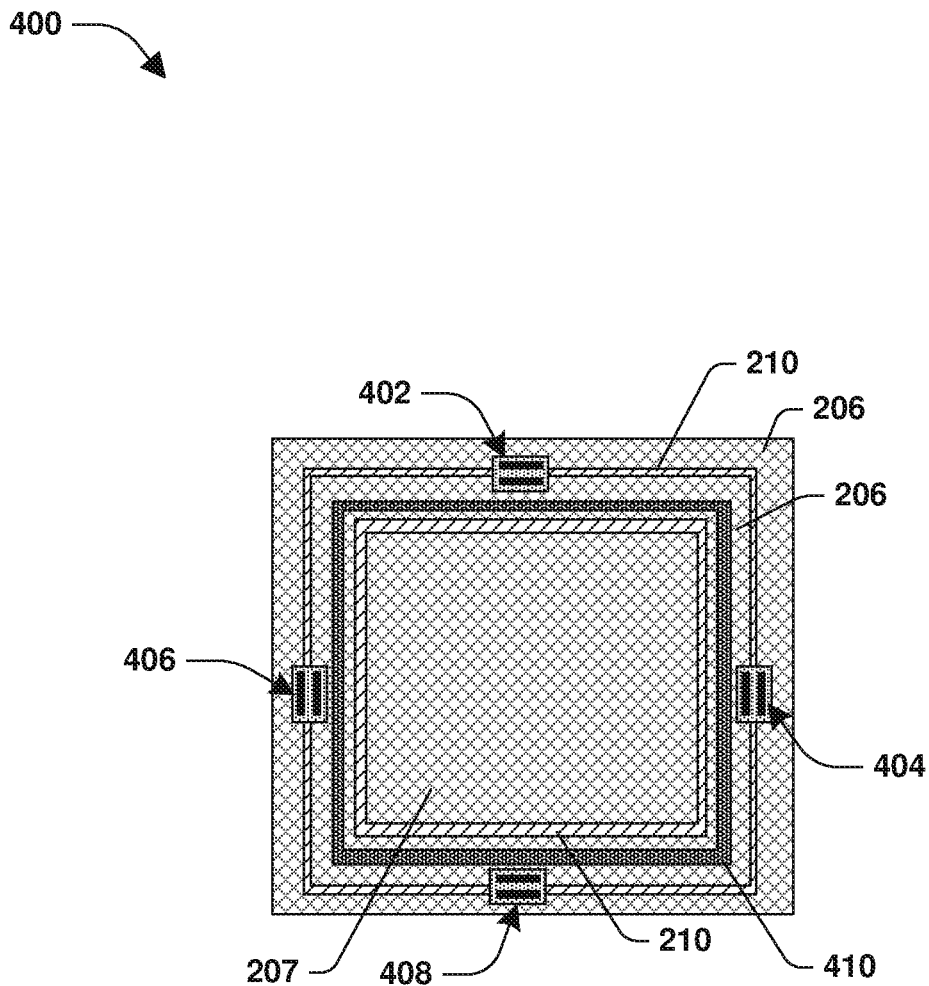
FIG. 4 is a top down view of an apparatus configured with a snubber layer.

It may be appreciated that an embodiment of an RC snubber that is integrated into a unipolar power transistor is further described in conjunction with FIGS. 2-4.

FIG. 2 illustrates a cross-sectional view of an apparatus 200 comprising an RC snubber 201 integrated into a unipolar power transistor of the apparatus 200. The apparatus 200 comprises an active trench transistor cell region 202 within which one or more unipolar power transistors are located. In an embodiment, a source 244 of a unipolar power transistor is located within the active trench transistor cell region 202. The apparatus 200 comprises a gate pad area 204 within which a gate pad of a gate 207 of the apparatus 200 is formed. The apparatus 200 comprises a semiconductor substrate 212. In an embodiment, the semiconductor substrate 212 comprises a silicon carbide substrate. In an embodiment, the silicon carbide substrate is an n+ silicon carbide substrate. In an embodiment, the semiconductor substrate 212 comprises a gallium nitride substrate. It may be appreciated that the semiconductor substrate 212 may comprise other materials.

The apparatus 200 comprises a first layer 214. In an embodiment, the first layer 214 is a drift zone layer, such as an n− drift zone layer. In an embodiment, the first layer 214 is positioned over the semiconductor substrate 212 of the apparatus 200. In an embodiment, the first layer 214 is an n-doped drift zone comprising n type material. In an embodiment, the first layer 214 is an n type layer forming part of a capacitor 220 of the RC snubber 201.

The apparatus 200 comprises a second layer 210. In an embodiment, the second layer 210 is an anode layer, such as a p+ type anode layer. In an embodiment, the second layer 210 is connected to the source 244. In an embodiment, the second layer 210 is positioned over the first layer 214 of the apparatus 200. In an embodiment, the second layer 210 is a p type layer forming a part of the capacitor 220 of the RC snubber 201. In this way, the first layer 214 as the n type layer and the second layer 210 as the p type layer form a p-n junction of the capacitor 220 of the RC snubber 201. The p-n junction protects a drain 242 of the unipolar power transistor of the apparatus 200.

The apparatus 200 comprises a third layer 222. In an embodiment, the third layer 222 is a gate oxide layer. In an embodiment, the third layer 222 comprises a gate oxide material, such as a silicon dioxide material, a high-k material, a dielectric material, etc. In an embodiment, the third layer 222 is positioned over the second layer 210.

The apparatus 200 comprises a poly silicon structure 221, such as an s-poly plate. In an embodiment, the poly silicon structure 221 is positioned over the third layer 222 such as over the gate oxide layer. In an embodiment, the poly silicon structure 221 is positioned within the gate pad area 204. In an embodiment, the poly silicon structure 221 is used to separate the drain 242 of the unipolar power transistor from the gate 207 of the unipolar power transistor. In an embodiment, the gate 207 comprises a conductive material. In an embodiment, the conductive material comprises aluminum copper AlCu or other metal or conductive material. In an embodiment, the poly silicon structure 221 is connected to a source snubber potential (Ssn) (e.g., a portion of the source structure 206 positioned over the poly silicon structure 221 and the resistor 218).

The apparatus 200 comprises an inter layer dielectric (ILD) layer 208. In an embodiment, the ILD layer 208 comprises a low-k dielectric material, such as a material having a k-value (dielectric constant) lower than about 3.9. Some low-k dielectric materials have a k-value lower than about 3.5 and may have a k-value lower than about 2.5. Some examples of low-k dielectric materials are $SiO_xC_yH_z$, $SiO_x$, SiCN, oxygen doped SiC (ODC), nitrogen doped SiC (NDC), chemical vapor deposition (CVD) from tetraethyl orthosilicate (TEOS), or other suitable material, where x, y, and z are integers greater than or equal to 1. In an embodiment, a portion of the ILD layer 208 within the gate pad area 204 is positioned between the gate 207 of the unipolar power transistor and the poly silicon structure 221. In an embodiment, other portions of the ILD layer 208 within the active trench transistor cell region 202 are positioned over poly silicon trench gate structures 224 within the active trench transistor cell region 202. In an embodiment, the poly silicon trench gate structures 224 within the active trench transistor cell region 202 are positioned between the ILD layer 208 and the third layer 222 (e.g., the gate oxide layer), such as where the ILD layer 208 is positioned adjacent to a top side of a poly silicon trench gate structure 224 and the third layer 222 (e.g., the gate oxide layer) is positioned adjacent to one or more of a bottom side, a first side, and/or a second side of the poly silicon trench gate structure 224.

The apparatus 200 comprises the source structure 206. In an embodiment, the source structure 206 comprises the source 244 of the unipolar power transistor. In an embodiment, the source structure 206 comprises a conductive material. In an embodiment, the conductive material comprise aluminum copper AlCu or other metal or conductive material. In an embodiment, a first dimension (e.g., a height) of the source structure is between about 3 μm and about 7 μm, such as about 5 μm or any other size. In an embodiment, a portion of the source structure 206 within the active trench transistor cell region 202 is positioned over the poly silicon trench gate structures 224. In an embodiment, another portion of the source structure 206, such as the source snubber potential (Ssn), is positioned between the source 244 of the unipolar power transistor and the gate 207 of the unipolar power transistor.

The apparatus 200 comprises contact metal structures 232. In an embodiment, the contact metal structures 232 are positioned within the active trench transistor cell region 202. In an embodiment, the contact metal structures 232 are positioned between portions of the ILD layer 208 that are overlaying the poly silicon trench gate structures 224 within the active trench transistor cell region 202.

The apparatus 200 comprises source material structures 230. In an embodiment, the source material structures 230 comprises n+ source material. In an embodiment, the source material structures 230 are positioned below one or more contact metal structures 232 within the active trench transistor cell region 202.

The apparatus 200 comprises body structures 228. In an embodiment, the body structures 228 comprise p− material. In an embodiment, the body structures 228 are positioned below the source material structures 230 within the active trench transistor cell region 202.

The apparatus 200 comprises structures 226. In an embodiment, the structures 226 comprise n− type material. In an embodiment, the structures 226 are positioned below the body structures 228 within the active trench transistor cell region 202.

In an embodiment, the source material structures 230, the body structures 228, and the structures 226 form npn structures. An npn structure is used as a channel for the unipolar power transistor through which current can flow.

The apparatus 200 comprises the RC snubber 201 that is integrated into and is formed as part of the apparatus 200 and the unipolar power transistor. The RC snubber 201 and the unipolar transistor are coupled in parallel. In particular, the RC snubber 201 and the unipolar power transistor are monolithically formed on the semiconductor substrate 212. That is, the RC snubber 201 and the unipolar power transistor are formed on the same semiconductor substrate 212. The RC snubber 201 comprises a resistor 218 and the capacitor 220. In an embodiment, the resistor 218 is comprised of n+ material 216, such as n+ material 216 connected to the source 244 of the unipolar power transistor (e.g., connected to a portion of the source structure 206 positioned over the resistor 218). In an embodiment, the resistor 218 is formed from an n type source doping bridge within the unipolar power transistor. In an embodiment, the resistor 218 has a resistance between about 500 kΩ and about 1.5 kΩ, such as about 1 kΩ or any other resistance. In an embodiment, the n+ material 216 may have a resistance between about 400 Ω/sq and about 800 Ω/sq, such as 600 Ω/sq or any other resistance. In an embodiment, the resistor 218 has a length between about 15 µm and about 25 µm, such as about 20 µm or any other length. In an embodiment, the resistor 218 has a width between about 8 µm and about 16 µm, such as about 12 µm or any other width. In an embodiment, the resistance of the resistor 218 and a capacitance Coss of the capacitor 220 (e.g., 20 pF, 50 pF, etc.) can be adapted by using different widths and lengths for the resistor 218.

In an embodiment, the resistor 218 is positioned below the source 244 of the unipolar power transistor, such as below the source structure 206. In an embodiment, the resistor 218 is positioned below a portion of the ILD layer 208. A portion of the third layer 222 (e.g., the gate oxide layer) may be positioned between the portion of the ILD layer 208 and the resistor 218. The resistor 218 may be positioned over the second layer 210. In an embodiment, the resistor 218 is the result of a dopant implant. In an embodiment, the resistor 218 is formed by n type material (e.g., a n+ implant) that is used as a source region for the unipolar power transistor. In this way, n type material of the unipolar power transistor is also used for the resistor 218, and also poly material of the unipolar power transistor (e.g., the poly silicon structure 221) is also used to form the RC snubber 201, and thus the RC snubber 201 is integrated into the apparatus 200 as part of the unipolar power transistor. Thus, the RC snubber 201 can be formed without additional layers and components within the apparatus 200.

The capacitor 220 is positioned between the poly silicon structure 221 and the semiconductor substrate 212. In an embodiment, the capacitor 220 comprises a p-n junction. The p-n junction comprises p type material of the second layer 210 (e.g., the anode layer). The p-n junction comprises n type material of the first layer 214 (e.g., the drift zone layer). The p-n junction is used to protect the drain 242 of the unipolar power transistor. The capacitor 220 is electrically connected to the resistor 218. In this way, the resistor 218 and the capacitor 220 of the RC snubber 201 are integrated into the apparatus 200 and the unipolar power transistor in order to dampen oscillations associated with the unipolar power transistor being switched between states, which would otherwise cause electromagnetic interference adversely affecting the operation of the apparatus 200.

FIG. 3 illustrates a top down view 300 of the apparatus 200. The resistor 218 is formed from the n+ material 216. The resistor 218 is positioned over the second layer 210. The resistor 218 is positioned over the contact metal structures 232. The resistor 218 has a length 302 between about 15 µm and about 25 µm, such as about 20 µm or any other length. The resistor 218 has a width 304 between about 8 µm and about 16 µm, such as about 12 µm or any other width. The length 302 and the width 304 may be design parameters that may be sized according to various criteria, such as sized to provide a particular resistance for the RC snubber 201, such as to achieve a resistance of about 1 kΩ. The top down view 300 also illustrates the gate 207, portions of the ILD layer 208, and the first layer 214 (e.g., the drift zone layer).

FIG. 4 illustrates a top down view 400 of certain layers (e.g., some layers are visible for illustrative purposes, while other layers, such as the ILD layer 208 and the poly silicon structure 221, are not visible so that the substrate 212 is visible) of the apparatus 200 configured with a snubber layer. The snubber layer comprises the RC snubber 201 integrated into the apparatus 200 and the unipolar power transistor. The RC snubber layer also comprises a plurality of resistors, as opposed to the single resistor 218 illustrated by FIGS. 2 and 3. The plurality of resistors comprise a first resistor 402, a second resistor 404, a third resistor 406, and a fourth resistor 408. It may be appreciated that the number of resistors of the plurality of resistors may comprise any number of resistors, and that 4 resistors are illustrated merely as an example. The first resistor 402, the second resistor 404, the third resistor 406, and the fourth resistor 408 are distributed around the gate 207 of the unipolar power transistor. In an embodiment, the first resistor 402, the second resistor 404, the third resistor 406, and the fourth resistor 408 are shunted in parallel. In an embodiment, the first resistor 402, the second resistor 404, the third resistor 406, and the fourth resistor 408 are resistance regions that connect source snubber potential (Ssn) (e.g., a portion of the source structure 206 positioned over the resistor 218) to the source 244 of the unipolar power transistor. The top down view 400 also illustrates a layer through a void 410 (e.g., as illustrated in FIG. 2, an opening in the ILD layer 208 through which the source structure 206 contacts the poly silicon structure 221 (e.g., through which the connection between the resistor 218 and the capacitor 220 passes)) and the second layer 210.

The RC snubber 201 of the apparatus 200 provides improved dampening of oscillations without using additional components (e.g., components external to the unipolar power transistor) since the RC snubber 201 is integrated into the apparatus 200 and the unipolar power transistor (e.g., a resistor and capacitor of the RC snubber 201 are formed from portions of the unipolar power transistor). Because the RC snubber 201 is incorporated into the apparatus 200 and the unipolar power transistor, such as within an area under the gate 207 (a gate pad) that is already part of the apparatus 200, little to no additional area is consumed by the RC snubber 201. The RC snubber 201 provides dissipation of power loss in the RC snubber 201 because the apparatus 200 is well cooled. The RC snubber 201 can work directly against oscillation to dampen the oscillation because there is no parasitic inductance involved. The RC snubber 201 scales with the number of parallel apparatuses/transistors in a module because RC snubbers are integrated into each apparatus/transistor. Because the RC snubber 201 is integrated with the unipolar power transistor as opposed to being external to the unipolar power transistor, leak inductance otherwise occurring between external RC snubber and the unipolar power transistor are reduced or eliminated. The RC snubber 201 also softens the switching behavior of the unipolar power transistor.

An embodiment of the presently disclosed subject matter comprises an apparatus. The apparatus comprises a unipolar power transistor; and an RC snubber comprising: a capacitor between a poly silicon structure and a semiconductor substrate, wherein the capacitor comprises a p-n junction; and a resistor between a source of the unipolar power transistor and a first layer forming the capacitor; wherein the unipolar power transistor and the RC snubber are coupled in parallel, and wherein the RC snubber and the unipolar power transistor are formed monolithically on the semiconductor substrate.

According to some embodiments, the semiconductor substrate comprises a silicon carbide substrate.

According to some embodiments, the p-n junction comprises p type material of the first layer and n type material of a second layer.

According to some embodiments, the second layer is between the first layer and the semiconductor substrate.

According to some embodiments, the resistor is formed from an n type source doping bridge within the unipolar power transistor.

According to some embodiments, the poly silicon structure is connected to the source.

According to some embodiments, the poly silicon structure separates a drain of the unipolar power transistor from a gate of the unipolar power transistor.

According to some embodiments, the resistor comprises an n type material layer connected to the source.

According to some embodiments, the resistor is electrically coupled to the capacitor.

According to some embodiments, the first layer comprises a p type material.

According to some embodiments, the unipolar power transistor comprises a 3 terminal transistor.

According to some embodiments, the unipolar power transistor comprises at least one of a silicon carbide metal-oxide-semiconductor field-effect transistor (MOSFET) or a silicon carbide junction gate field-effect transistor (JFET).

According to some embodiments, the capacitor is located at an output side of the unipolar power transistor.

According to some embodiments, the semiconductor substrate comprises a gallium nitride substrate.

According to some embodiments, the apparatus comprises an RC snubber layer comprising: the RC snubber, and a plurality of resistors, wherein the plurality of resistors comprises the resistor.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

As used in this application, the terms "component," "module," "system", "interface", and the like are generally intended to refer to a computer-related entity, either hardware, a combination of hardware and software, software, or software in execution. One or more components may be localized on one computer and/or distributed between two or more computers.

Furthermore, the claimed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. Of course, those skilled in the art will recognize many modifications may be made to this configuration without departing from the scope or spirit of the claimed subject matter.

Various operations of embodiments are provided herein. In one embodiment, one or more of the operations described may constitute computer readable instructions stored on one or more computer readable media, which if executed by a computing device, will cause the computing device to perform the operations described. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein.

Any aspect or design described herein as an "example" is not necessarily to be construed as advantageous over other aspects or designs. Rather, use of the word "example" is intended to present one possible aspect and/or implementation that may pertain to the techniques presented herein. Such examples are not necessary for such techniques or intended to be limiting. Various embodiments of such techniques may include such an example, alone or in combination with other features, and/or may vary and/or omit the illustrated example.

As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims may generally be construed to mean "one or more" unless specified otherwise or clear from context to be directed to a singular form. Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated example implementations of the disclosure. In addition, while a particular feature of the disclosure may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. An apparatus, comprising:
a unipolar power transistor; and
an RC snubber comprising:
    a capacitor between a poly silicon structure of the unipolar power transistor and a semiconductor substrate, wherein the capacitor comprises a p-n junction comprised of an n type layer and an p type layer, wherein the p type layer is between the n type layer and the poly silicon structure; and
    a resistor between a source of an active transistor cell region of the unipolar power transistor and the p type layer forming the capacitor, wherein the resistor is formed from n type material of an n type dopant implant connected to the source;
wherein the unipolar power transistor and the RC snubber are coupled in parallel, and
wherein the RC snubber and the unipolar power transistor are formed monolithically on the semiconductor substrate.

2. The apparatus of claim 1, wherein the semiconductor substrate comprises a silicon carbide substrate.

3. The apparatus of claim 1, wherein the n type layer forms a drift zone layer of the unipolar power transistor.

4. The apparatus of claim 1, wherein the n type material of the resistor forms of a source region for the unipolar transistor.

5. The apparatus of claim 1, wherein the n type dopant implant forms an n type source doping bridge within the unipolar power transistor.

6. The apparatus of claim 1, wherein the poly silicon structure is connected to the source.

7. The apparatus of claim 1, wherein the poly silicon structure separates a drain of the unipolar power transistor from a gate of the unipolar power transistor.

8. The apparatus of claim 1, wherein the resistor is connected to a portion of the source positioned over the resistor.

9. The apparatus of claim 1, wherein the resistor is electrically coupled to the capacitor.

10. The apparatus of claim 1, wherein the unipolar power transistor comprises a silicon carbide metal-oxide-semiconductor field-effect transistor (MOSFET).

11. The apparatus of claim 1, wherein the unipolar power transistor comprises a 3 terminal transistor.

12. The apparatus of claim 1, wherein the unipolar power transistor comprises a silicon carbide junction gate field-effect transistor (JFET).

13. The apparatus of claim 1, wherein the capacitor is located at an output side of the unipolar power transistor.

14. The apparatus of claim 1, wherein the semiconductor substrate comprises a gallium nitride substrate.

15. The apparatus of claim 1, comprising:
an RC snubber layer comprising:
    the RC snubber, and
    a plurality of resistors, wherein the plurality of resistors comprises the resistor.

* * * * *